(12) United States Patent
Liu

(10) Patent No.: US 6,496,545 B1
(45) Date of Patent: Dec. 17, 2002

(54) SINGLE SIDE-BAND MIXER

(75) Inventor: Ting-Ping Liu, Holmdel, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/241,992

(22) Filed: Feb. 2, 1999

(51) Int. Cl.[7] .............................. H03C 1/52; H04L 27/04
(52) U.S. Cl. ........................ 375/301; 375/270; 332/170; 445/47; 445/109
(58) Field of Search ................................ 375/270, 301, 375/321; 332/170, 171; 455/47, 109, 203

(56) References Cited

U.S. PATENT DOCUMENTS

| | | | | |
|---|---|---|---|---|
| 3,868,601 A | * | 2/1975 | MacAfee | 332/170 |
| 4,994,769 A | * | 2/1991 | Kishi | 332/170 |
| 5,115,468 A | * | 5/1992 | Asahi et al. | 704/203 |
| 5,394,118 A | * | 2/1995 | Darges et al. | 332/170 |

OTHER PUBLICATIONS

Haykin, "An Introduction to Analog And Digital Communications", copyright 1989 by John Wiley & Son, Inc., pp. 292 and 293.*

* cited by examiner

Primary Examiner—Chi Pham

Assistant Examiner—Phuong Phu

(74) Attorney, Agent, or Firm—Henry I. Schanzer

(57) ABSTRACT

In accordance with the invention, a single sideband mixer includes first and second all-pass 90° phase shifters. Each phase shifter produces two outputs of substantially equal amplitude but subject to a phase angle error (θ) indicative of a deviation from quadrature of the two outputs. The phase angle errors of the first and second phase shifters are designed to be equal and to track each other over different ambient and operating voltage conditions. In one embodiment, the outputs of the first phase shifter are coupled via a cross switch to the inputs of two mixers and the outputs of the second phase shifter are fixedly connected to the inputs of the two mixers. The outputs of the two mixers are combined to produce an output whose frequency is a function of either the sum or the difference of first and second input frequency signals respectively applied to the first and second phase shifters.

18 Claims, 8 Drawing Sheets

0.6-Ghz PHASE SHIFTER 1.4-6hz PHASE SHIFTER

SINGLE SIDE-BAND MIXER

BACKGROUND OF THE INVENTION

This invention relates to mixer circuits and, in particular, to single-sideband mixers which may be used to produce single or dual frequencies with high sideband rejection.

It is known to use "mixers" to mix two input signals, where one input signal has a frequency $\omega 1$ (i.e., $2\pi$ f1) and the other input signal has a frequency $\omega 2$ (i.e., $2\pi$ f2), to produce a first output signal having a lower frequency (i.e., the lower sideband) equal to the difference (i.e., $\omega 1 - \omega 2$) of the two input signal frequencies and/or a second output signal having an upper frequency (i.e., the upper sideband) equal to the sum (i.e., $\omega 1 + \omega 2$) of the two input signal frequencies. A single-sideband (SSB) mixer system is highly suited for generating dual-band (i.e., upper and/or lower sidebands) carrier signals for frequency translations with electronic band selection capability since it can provide either an upper or a lower sideband output by means of an electronic control.

However, it is essential for the single sideband (SSB) mixer system to have high sideband rejection in both frequency bands. That is, when the lower sideband is selected to be produced at the output of the SSB mixer system, there must be a high degree of rejection of the upper sideband and, vice versa, when the upper sideband is selected to be produced at the output of the SSB mixer system, there must be a high degree of rejection of the lower sideband.

A problem in accomplishing this result is illustrated by referring to FIG. 1 which shows a block diagram of a prior art single-frequency SSB mixer system 10. The mixer system 10 includes a first 90-degree phase shifter, 12, a second 90-degree phase shifter, 14, a first mixer, 16, a second mixer, 18, and an output combiner/summer, 20. Each one of 90-degree phase shifters 12 and 14, has two outputs. Phase shifter 12 has two "quadrature" outputs V11 and V12, where V11 is equal to $A_1 \cos \omega_1 t$ and V12 is equal to $B_1 \sin(\omega_1 t + \theta_1)$; and phase shifter 14 has two "quadrature" outputs V21 and V22, where V21 is equal to $A_2 \cos \omega_2 t$ and V22 is equal to $B_2 \sin(\omega_2 t + \theta_2)$.

Ideally, the two outputs of each phase shifter should have the same amplitude (i.e., $A_1 = B_1$ and $A_2 = B_2$) and the two outputs should be at 90 degrees (orthogonal or in quadrature) with respect to each other (i.e., $\theta_1 = \theta_2 = 0$). However, in practice, the amplitude of the two outputs of each phase shifter may not be equal to each other (i.e., there is an amplitude imbalance) and there is a phase error, denoted by the phase angle $\theta$, which is equal to the angle by which the difference between the two supposedly orthogonal outputs of a phase shifter is greater, or less, than 90 degrees. Accordingly, in the discussion to follow and in the appended claims, when reference is made to a 90° phase shifter, without further qualification, what is meant is a phase shifter which is intended to produce two equal amplitude signals which are at 90° to each other. However, in practice, due to various circuit limitations, the amplitude of the two output signals may not be equal (unless otherwise specified) and the phase angle between the two supposedly orthogonal output signals of a "90° phase shifter" may be greater, or less, than 90°.

In the ideal case, the single frequency SSB mixer of FIG. 1 generates an output ($V_{OUT}$) at the output of the combiner 20, whose frequency is solely equal to the upper sideband components ($\omega 1 + \omega 2$). [If the outputs of the first phase shifter 12 were switched so that V11 were applied to mixer 18 and V12 to mixer 16, then the output $V_{OUT}$ would have a frequency which, ideally, would solely equal to the lower sideband components ($\omega 1 - \omega 2$).] In practice, however, both sidebands are present at the output of the combiner 20 due to non-quadrature phase (non-zero $\theta 1$ and $\theta 2$) or amplitude imbalance (between $A_1$ and $B_1$, and between $A_2$ and $B_2$) introduced by phase shifters, 12 and 14.

It is known to form the phase shifters using conventional high-pass low-pass RC-CR networks of the type shown in FIG. 2A. The FIG. 2A networks yield two single-ended quadrature signals $V_1$ and $V_2$. These signals generally have the proper phasal relationship (i.e., 90°) but, the amplitudes of V1 and V2 are balanced only when $\omega RC=1$. Supplying "quadrature" signals to the mixers which have the correct phasal relationship (i.e., 90°) but which have unequal amplitude is problematic because the mixers introduce amplitude nonlinearity which makes the amplitude compensation difficult. The amplitude imbalance can be reduced by using a limiting stage to equalize the amplitude of the quadrature signals. However, these attempts normally result in excessive nonlinear limiting which, while equalizing the amplitude of the signals, causes significant phase error and the deterioration of the overall mixer system performance.

Thus, production of upper and lower sidebands with high sideband rejection is not readily achieved with single sideband mixer systems formed with high-pass low-pass 90° phase shifters.

SUMMARY OF THE INVENTION

Applicant's invention resides, in part, in the recognition that a single sideband mixer including two supposedly 90° phase shifters may be used to produce upper and/or lower sidebands with a high degree of sideband rejection even when the phase shifters have a phase angle error ($\theta$), so long as the phase angle error of the two phase shifters are substantially equal and the amplitude of the two orthogonal outputs of each phase shifter have substantially equal amplitudes.

Thus, in contrast to the prior art, a single sideband mixer system embodying the invention includes the application of first and second input frequencies ($\omega 1$, $\omega 2$) to first and second 90° all-pass phase shifters to produce first and second supposedly orthogonal outputs per phase shifter. The outputs of the two phase shifters are then applied to inputs of first and second mixer circuits whose outputs are then combined to produce either the upper (the sum of $\omega 1$ and $\omega 2$) or the lower (the difference between $\omega 1$ and $\omega 2$) sidebands of the two input frequencies. The all-pass type phase shifters are used to ensure that there is little, if any, amplitude imbalance in the 90° degree phase shifter outputs.

The first and second 90° phase shifters embodying the invention are preferably formed such that any phase error (i.e., $\theta 1$) in the first phase shifter is essentially equal to any phase error (i.e., $\theta 2$) in the second phase shifter and that the phase errors $\theta 1$ and $\theta 2$ track each other. Accordingly, in systems embodying the invention, the first and second phase shifters are preferably formed within an integrated circuit and in close proximity to each other so that they track each other over time and varying ambient and voltage conditions. The outputs of the first and second phase shifters are supplied to mixer circuits whose outputs are combined. If the phase error of the two phase shifters track, the phase errors are significantly reduced when the mixer outputs are combined to produce an output signal $V_{OUT}$.

According to one aspect of the invention, the first and second supposedly orthogonal outputs of the first 90° phase shifter are respectively coupled via selectively enabled switching means to the inputs of the first and second mixers and the first and second supposedly orthogonal outputs of the second 90° phase shifter are respectively fixedly coupled to the inputs of the first and second mixers. The outputs of the first and second mixers are then combined to produce either the upper sidebands or the lower sidebands of the first and second frequency input signals applied to the first and second 90° phase shifters. For one condition of the selectively enabled switching means (e.g., the "thru" mode) the upper sidebands are produced and for another condition of the selectively enabled switching means (e.g., the "reverse" mode) the lower sidebands are produced.

In an integrated circuit embodying the invention, the outputs of the two mixer circuits are hard wired to each other to combine the outputs of the two mixers (e.g., the current output from one mixer is subtracted from the current output of the other mixer).

BRIEF DESCRIPTION OF THE DRAWINGS

In the accompanying drawing like reference characters denotes like components.

DETAILED DESCRIPTION OF THE INVENTION

Figure 1:
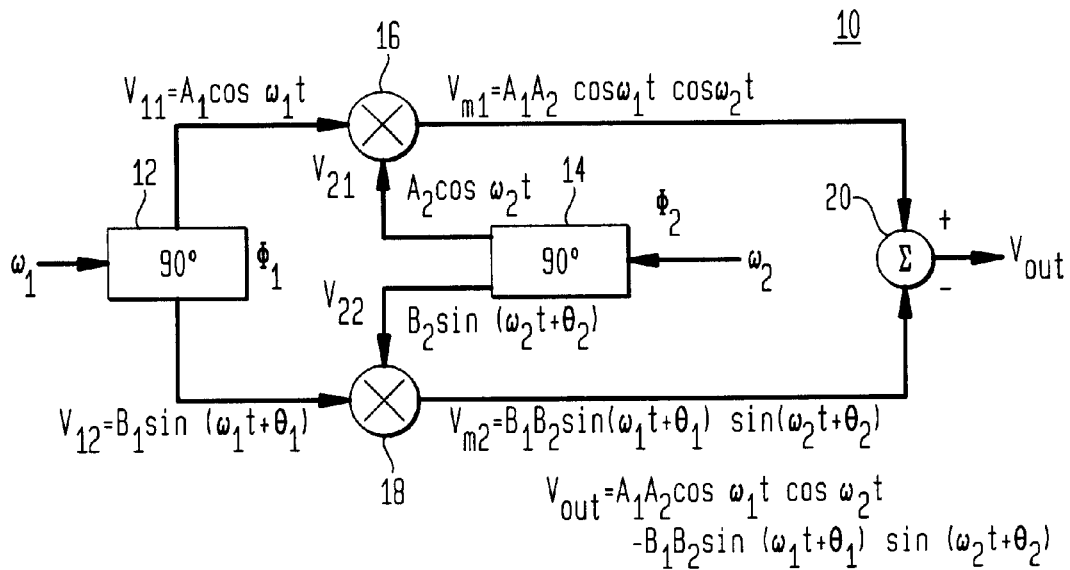
FIG. 1 is a block diagram of a prior art single frequency single sideband mixer.
Figure 3:
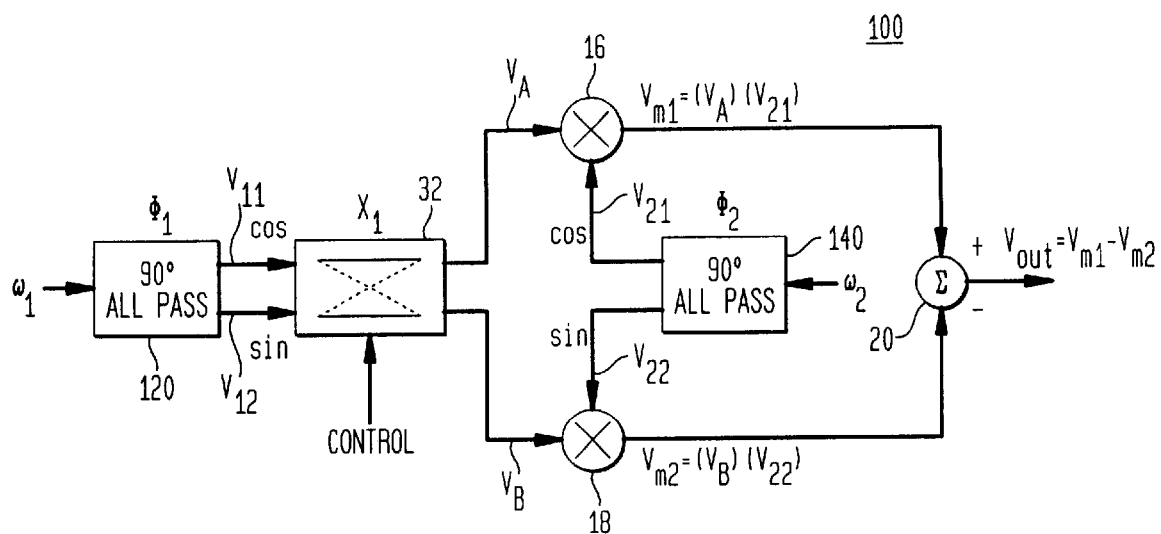
FIG. 3 is a block diagram of a dual frequency single-sideband mixer system embodying the invention.

FIG. 3 is a block diagram of a dual-frequency single sideband mixer system embodying the invention. The mixer system 100 shown in FIG. 3 differs from the prior art mixer system of FIG. 1 in that the phase shifters (120, 140) are of the all-pass type and the outputs of the phase shifters may be switched such that the mixer system 100 may provide either the upper sidebands or the lower sidebands of the input frequencies ($\omega_1, \omega_2$).

Figure 4:
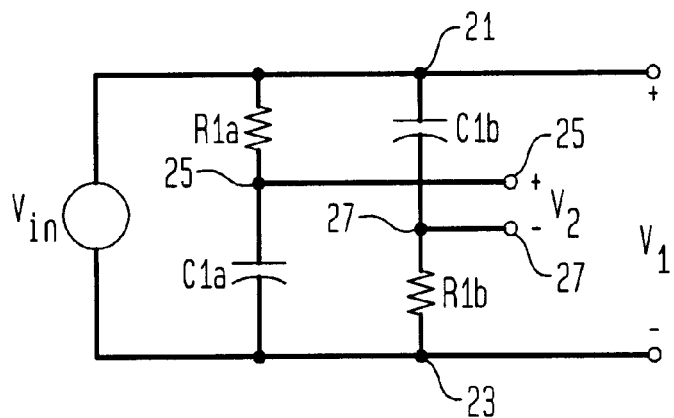
FIG. 4 is an idealized schematic diagram of an all-pass phase shifter network for use in phase shifter circuits to be used in mixer systems embodying the invention.

To better understand the significance of using all-pass type phase shifters reference is made to FIG. 4. FIG. 4 shows the basic structure of an all-pass RC phase shifter network for incorporation in phase shifters employed in mixer systems embodying the invention. The all-pass network of FIG. 4 includes two parallel branches connected between terminals 21 and 23; one of the branches includes a resistor R1$a$ connected between terminal 21 and an intermediate node 25 and a capacitor C1$a$ connected between node 25 and terminal 23. The other branch includes a capacitor C1$b$ connected between terminal 21 and an intermediate node 27 and a resistor R1$b$ connected between node 27 and terminal 23. Resistors R1$a$ R1$b$ have the same resistive values, and capacitors C1$a$ and C1$b$ have the same capacitance values. The values of the resistors and capacitors used in each phase shift network are determined from the relationship $\omega RC=1$. Given the desired frequency of operation the values of resistance and capacitance are selected to be consistent with the process used to manufacture these components.

Figure 4A:
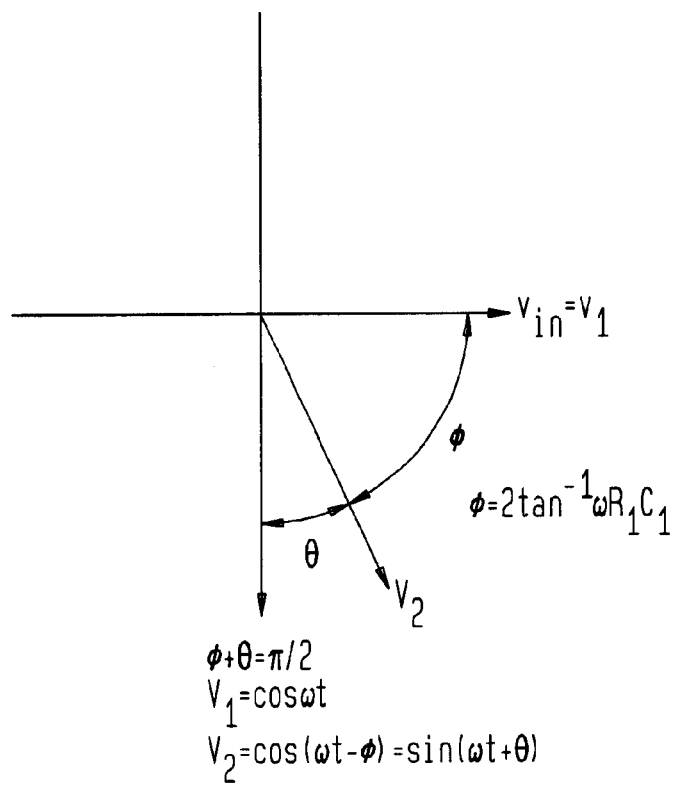
FIG. 4A illustrates the phasal relationship of the two outputs of an all pass phase shifter to define the phase angle error ($\theta$)

In FIG. 4, the differential signal developed across terminals 21 and 23 is denoted as V1 ($V_{IN}$) and the differential signal developed between nodes 25 and 27 is denoted as V2. An analysis of the frequency response of the circuit shows that the amplitude of V1 is equal to the amplitude of V2. However, the phase angle ($\phi$) between V1 and V2 is equal to $2\tan^{-1}\omega R_1 C_1$ as illustrated in FIG. 4A. That is, the phase angle f defines the angle by which V1, lying along the X-axis, leads V2 (or V2 lags V1) and the phase angle error $\theta$ defines the deviation of V2 from 90°.

Figure 2:
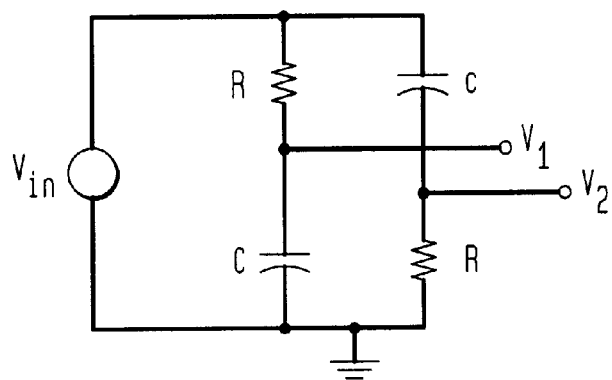
FIG. 2 is an idealized schematic diagram of a prior art high-pass low-pass network.

Thus, in contrast to the network of FIG. 2A, the all-pass RC network of FIG. 4 produces differential outputs $V_1$ and $V_2$ which are of equal amplitude at all frequencies. However, in the circuit of FIG. 4, the phase difference between V1 and V2 is $2\times\tan^{-1} \omega RC$, which means quadrature phase occurs only at a single angular frequency 1/RC. However, as noted above, applicant recognized that it is more difficult to correct errors in the amplitude domain than in the phase domain, since the mixer circuits introduce amplitude nonlinearity but preserve linear input-output relationship for phase. Hence, in mixer systems embodying the invention, all-pass type networks are employed in the phase shifters since they tend to generate amplitude balanced signals. As to any phase errors generated by these phase shifters, they may be subsequently corrected during the output combining operation, as further discussed below.

Phase shifters employed in mixer systems embodying the invention may have the same, or similar, characteristics as the all-pass type network described for FIG. 4.

Figure 5A:
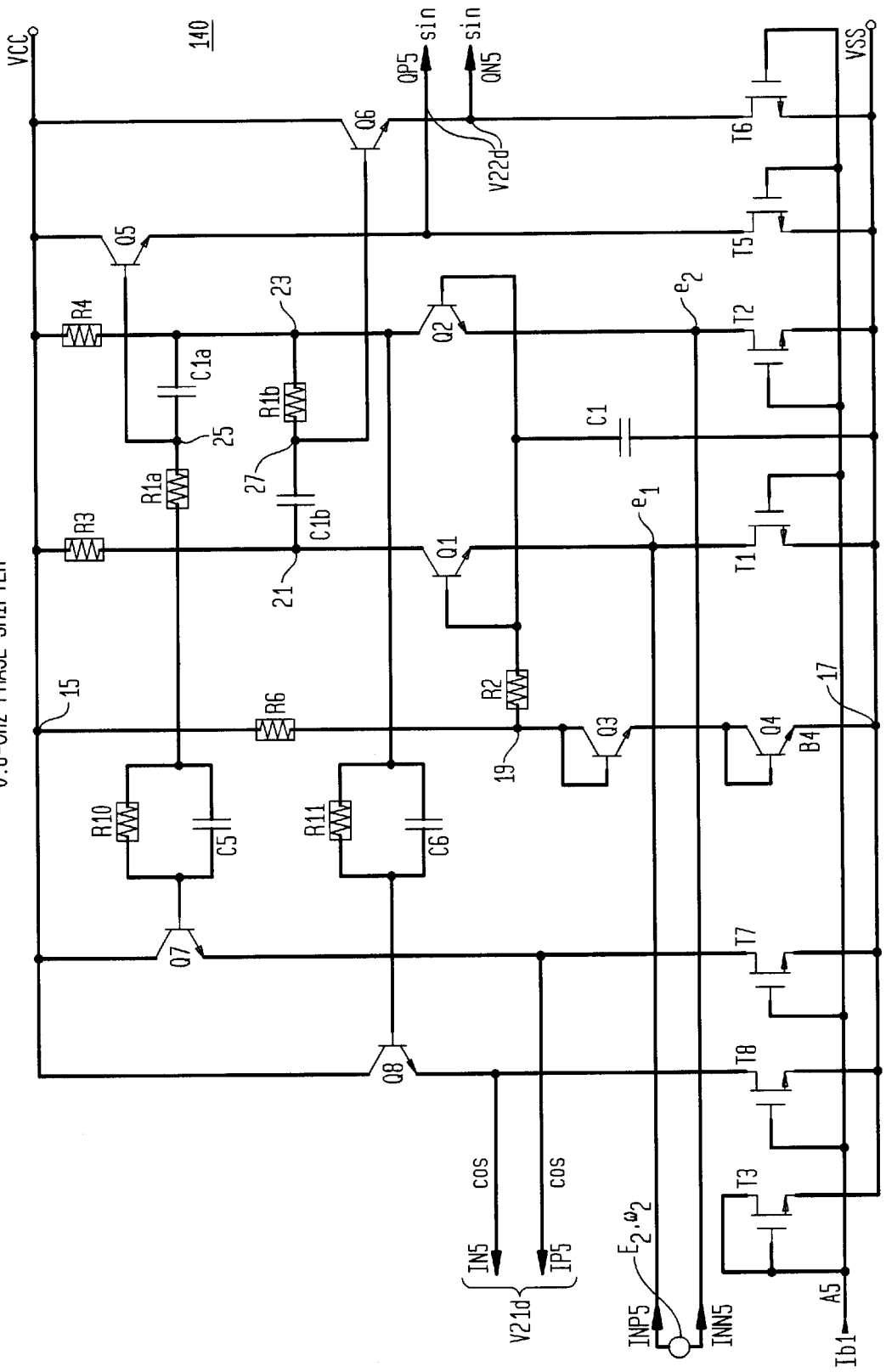
FIG. 5A is a schematic diagram of a phase shift circuit with an all-pass phase shifter network embodying the invention.
Figure 5B:
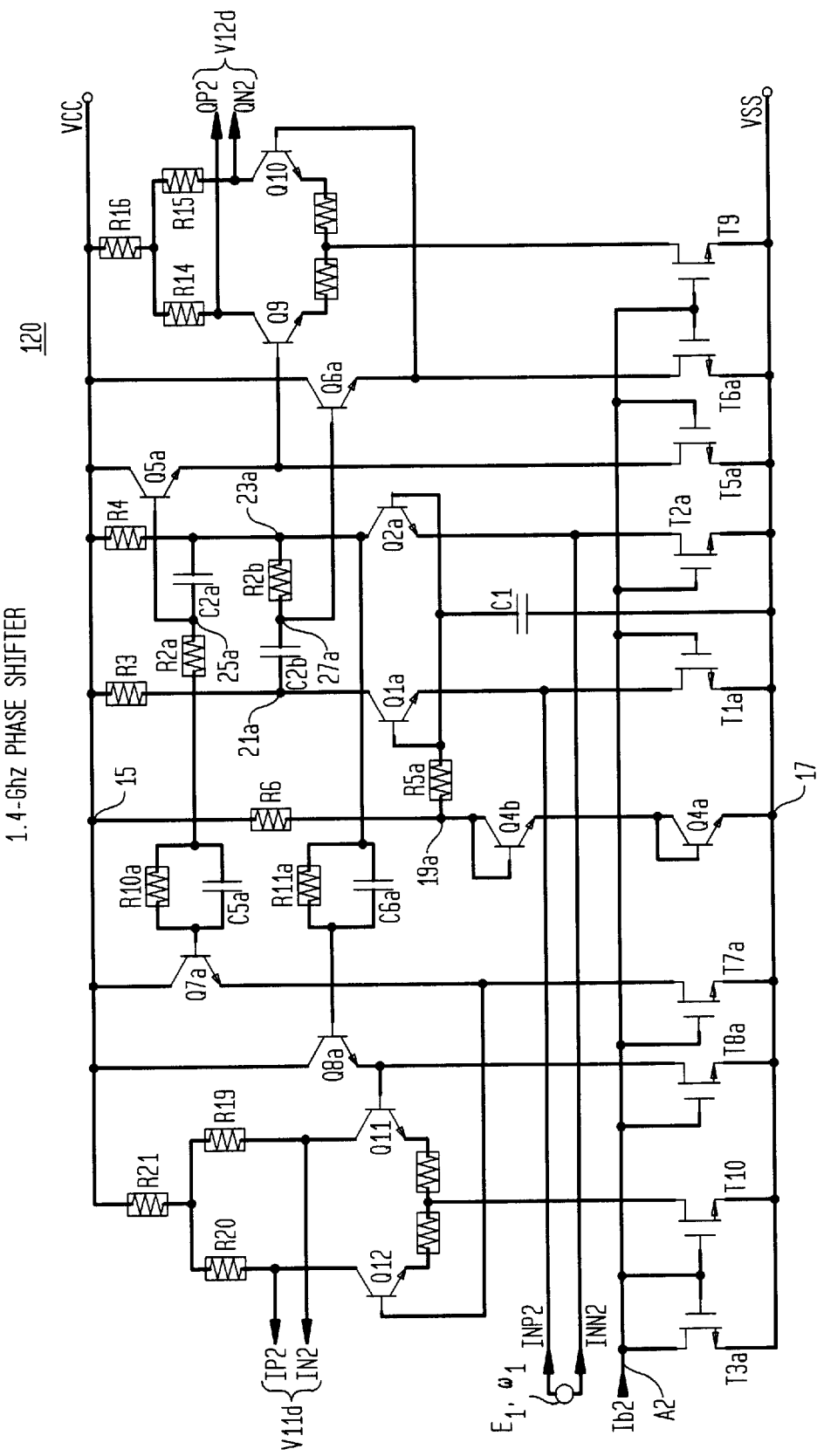
FIG. 5B is a schematic diagram of another phase shift circuit embodying the invention.

FIG. 3 shows the block diagram of a dual-frequency single-sideband mixer system, which, in accordance with the invention, employs all-pass type phase shifters which may be of the generic type shown in FIG. 4 and which may be implemented as shown in FIGS. 5A and 5B. The circuit of FIG. 3 includes a first all-pass 90° phase shifter 120 (see FIG. 5B) having a first output V11 and a second output V12. V11 is equal to $A_1 \cos \omega_1 t$ and V12 is equal to $B_1 \sin(\omega_1 t+\theta_1)$. The outputs V11 and V12 are supplied to a cross switch 32 which is responsive to a control signal. For one condition of the control signal (i.e., the "through" condition), V11 is coupled via switch 32 to a node VA which is connected to an input of mixer circuit 16 and V12 is coupled via switch 32 to a node VB which is connected to an input of mixer circuit 18. For another condition of the control signal (i.e., the "reverse" condition), V11 is coupled via switch 32 to node VB which is connected to an input of mixer circuit 18 and V12 is coupled via switch 32 to node VA which is connected to an input of mixer circuit 16.

The mixer system of FIG. 3 includes a second all-pass 90° phase shifter 140 (see FIG. 5A) having a first output V21 and a second output V22. V21 is equal to $A_2 \cos \omega_2 t$ and V22 is equal to $B_2 \sin(\omega_2 t+\theta_2)$. V21 is connected to an input of mixer 16 and V22 is connected to an input of mixer 18. The output (Vm1) of mixer 16 is equal to (V21) times (VA) and the output (Vm2) of mixer 18 is equal to (V22) times (VB); where VA and VB also refer to the voltage at those nodes, as well as the nodes themselves. The output Vm1 of mixer 16 and the output Vm2 of mixer 18 are combined to produce a mixer system output ($V_{OUT}$) which is equal to Vm1-Vm2. In FIG. 3, Vm1 and Vm2 are shown to be combined by a combiner/summer 20. However, as discussed below, the outputs of mixers 16 and 18 may be hard wired together to provide the combined output.

The desired sideband output can be electronically selected through the control signal applied to switch 32. To generate the upper sideband (which is equal to the sum frequency of $\omega1+\omega2$), cross switch 32 is switched to the "through" position. For this condition, VA is equal to V11 and VB is equal to V12, whereby Vm1 is equal to (V11)(V21) and Vm2 is equal to (V12)(V22). In systems embodying the invention, the inputs to the mixers 16 and 18 are switched by means of cross switch 32. The outputs of the mixers 16 and 18 are not switched, rather they remain fixedly connected so that Vm2 is always subtracted from Vm1. This is illustrated in FIG. 3 by applying Vm1 to the positive (+) input of combiner 20 and Vm2 to the minus (−) input of combiner 20. Switching the outputs of the mixers (rather than the outputs of one of the phase shifters applied to the inputs of the mixers) would not generally produce good phase tracking.

Where the phase shifters (120 and 140) supplying signals to the mixer circuits 16 and 18 are of the generic type shown in FIG. 4 (and implemented as shown in FIGS. 5A and 5B), and when the outputs of the two mixer circuits 16 and 18 are combined by a combiner 20 as shown in FIG. 3, Applicant recognized that the unselected sideband is rejected provided that each one of the two phase shifters produces balanced amplitudes (i.e., $A_1=B_1$ and $A_2=B_2$) and that the phase shifts of the two phase shifters are the same, i.e., $\theta_1=\theta_2$. That is, the lower sideband (difference frequency) is rejected when the upper sideband is selected and the upper sideband (the sum frequency) is rejected when the lower sideband is selected, even though $\theta1=\theta2$ are other than zero. Applicant's recognition may be expressed as follows:

I. For Upper Sideband Generation—the "Through" Mode

1. For equal amplitudes at the outputs of the phase shifters (i.e., $A_1=B_1$ and $A_2=B_2$), the output $V_{OUT}$ produce dby combining the outputs of mixers 16 and 18 may be expressed as follows:

$$V_{OUT}=A_1A_2[\cos\omega_1t\cos\omega_2t-\sin(\omega_1t+\theta t_1)\sin(\omega_2t+\theta_2)] \quad \text{eq. 1}$$

2. If $\theta_1=\theta_2=\theta$, $$V_{OUT} = A_1A_2[\cos^2\theta\cos(\omega_1+\omega_2)t - \sin\theta\cos\theta\sin(\omega_1+\omega_2)t] \quad \text{eq. 2}$$
$$= A_1A_2\cos\theta\{\cos[(\omega_1+\omega_2)t+\theta]\}$$

Therefore, no $(\omega_1-\omega_2)$ components exist in $V_{OUT}$ when the upper sideband is produced.

II. For the Lower Sideband Generation—the "Reverse" Mode

1. For equal amplitudes at the outputs of the phase shifters (i.e., $A_1=B_1$ and $A_2=B_2$), the output $V_{OUT}$ produced by combining the outputs of mixers 16 and 18 may be expressed as follows:

$$V_{OUT}=A_1A_2[\cos\omega_1t\sin(\omega_2t+\theta_2)-\cos\omega_2t\sin(\omega_1t+\theta_1)] \quad \text{eq. 3}$$

2. If $\theta_1=\theta_2=\theta$, $$V_{OUT} = A_1A_2/2\{\sin[(\omega_2-\omega_1)t+\theta] + \sin[(\omega_2-\omega_1)t-\theta]\} \quad \text{eq. 4}$$
$$= A_1A_2\{\sin[(\omega_2-\omega_1)t]\cos\theta\}$$

Therefore, no $(\omega_1+\omega_2)$ components exist in $V_{OUT}$ when the lower sidebands are produced.

As a result, Applicant recognized that an absolute accuracy of 90° phase is not needed for each phase shifter, as long as they produce similar phase shifts (relative phase accuracy).

As further detailed below, making the all-pass phase shift circuits 120 and 140 using monolithic IC techniques enables the formation of $\theta1=\theta2$ for all conditions (frequency ranges) of concern since two on-chip phase shifters can track out phase errors provided that $C_1R_1/C_2R_2=\omega_2/\omega_1$, where $R_1-C_1$ and $R_2-C_2$ are the resistors (R's) and the capacitors (C's) used in phase shifters 120 and 140, respectively. FIGS. 5A and 5B are schematic diagrams of all-pass phase shifter circuits suitable for practicing the invention and which are readily formed using IC techniques.

Assume, for example, that it is desirable to have a lower frequency band of 0.8 GHz and an upper frequency band of 2.0 GHz. To accomplish this result, the first phase-shifter 120 may be operated at $f_1=\omega_1/2Y=1.4$ GHz while the second phase shifter 140 may be operated at $f_2=\omega_2/2Y=0.6$ GHz.

The schematic diagram for a 0.6-GHz fully-differential all-pass RC ("supposedly" 90°) phase shifter circuit is illustrated in FIG. 5A. An operating voltage (Vcc and Vss) is applied between a positive power terminal 15 and a negative power terminal 17. An input signal (E2, $\omega$2) is applied to the balanced reference frequency inputs INP5 and INN5 which are respectively coupled to the emitters e1 and e2 of bipolar transistors Q1 and Q2 which are connected to form a differential common-base input stage. A bias voltage is generated at node 19 and this voltage is applied to the bases of Q1 and Q2. The bias voltage at node 19 is generated by connecting a resistor R6 between power terminal 15 and node 19 and by connecting the conduction paths of two diode connected transistors Q3 and Q4, in series, between node 19 and power terminal 17. A resistor R5 is connected between node 19 and the bases of Q1 and Q2. Noise contributions from resistors R5 and R6 and transistors Q3 and Q4 are rejected as common mode signals. Input matching is achieved by the input stage with an input impedance of $1/g_m$, where $g_m$ is the transconductance of transistors Q1 and Q2. Load resistors R3 and R4 are connected between terminal 15 and the collectors of Q1 and Q2, respectively. Load resistors R3 and R4 convert input current signals to voltage signals for the all-pass RC phase shifter network comprising two parallel branches similar to the networks shown in FIG. 4. In the first branch, resistor R1a is connected between a terminal 21 and a node 25 and capacitor C1a is connected between node 25 and a terminal 23. In the second branch, capacitor C1b is connected between terminal 21 and a node 27 and resistor R1b is connected between node 27 and terminal 23.

In the circuit of FIG. 5A the emitters of the bipolar transistors Q1, Q2, Q5, Q6, Q7,and Q8 are connected to like numbered current source transistors T1, T2, T5, T6, T7, T8. All the current sources are formed using metal oxide semiconductor (MOS), or complementary MOS (CMOS), devices for low-voltage operation. In the circuit of FIG. 5A, transistors T1, T2, T5, T6, T7, T8 are MOS transistors having their gates connected in common to terminal A5 and their sources connected in common to power terminal 17 to which is applied the most negative operating voltage (ground or Vss). A current Ib1 is injected into node A5 and transistors T1, T2, T5, T6, T7, T8 are sized to mirror the current flowing through diode connected transistor.

In response to an input signal (E2) which is assumed to have a frequency $\omega_2$, a first differential output voltage (V21d), E2cos $\omega$2t, is produced between terminals 21 and 23 and a second differential voltage (V22d), E2sin($\omega$2t+θ2), is produced between terminals 25 and 27. The voltages developed at nodes 25 and 27 are respectively applied to the bases of transistors Q5 and Q6. The resulting differential voltage produced across the emitters of transistors Q5 and Q6 defines the voltage V22d which corresponds to the voltage V22 of FIG. 3 (and the voltage V2 in FIG. 4). The voltages developed at nodes 21 and 23 are respectively applied to the bases of transistors Q7 and Q8 by means of parallel RC networks. Resistor R10 and capacitor C5 are connected in parallel between node 21 and the base of Q7. Resistor R11 is connected in parallel with a capacitor C6 between node 23 and the base of Q8. The resulting differential voltage. produced across the emitters of Q7 and Q8 defines the voltage V21d corresponding to the voltage V21 of FIG. 3 and the voltage V1 in FIG. 4).

Parallel RC network R10-C5 and R11-C6 are utilized to equalize the phase-shifter output amplitudes due to the loading of the bases of Q5 and Q6. Emitter followers Q5, Q6 and Q7, Q8 serve two purposes: (1) They isolate their phase shifter circuitry from the following stages, and (2) They provide driving (current) capabilities for the differential quadrature outputs V21d (phase leading) and V22d (see FIG. 5A).

Thus, the voltage across the output of emitter followers Q7, Q8 is V21d which may be expressed as $A_2 \cos \omega_2 t$ and the voltage across the output of emitter followers Q5, Q6 is V22d which may be expressed as $B_2 \sin(\omega_2 t + \theta_2)$. For the reasons discussed above, the amplitudes $A_2$ and $B_2$ may be assumed to be substantially equal to each other. Assuming V21d to be along the X-axis, the error phase angle $\theta_2$, indicative of the (positive or negative) deviation of V22d from 90°, is preferably small but may have a value in excess of 10 degrees. The outputs at the emitters of Q7, Q8 and the outputs at the emitters of Q5, Q6 defining V22d may be supplied to the input ports of mixers, as shown in, for example, FIG. 7.

The 1.4-GHz phase shifter circuit, shown in FIG. 5B, is similar to the 0.6-GHz phase shifter circuit shown in FIG. 5A version except that the RC time constant values of the all-pass phase shifter network are different. The time constant (R2a,C2a or R2b,C2b) of the all-pass network is chosen to be 6/14 times that of the 0.6-GHz counterpart shown in FIG. 5a. In addition, differential output driver stages Q9, Q10, Q11 and Q12 have been added. Differential amplifier stages, including transistors Q11, Q12 and transistors Q9, Q10, are used to provide gain and proper DC voltage level for differential quadrature outputs IP2-IN2 defining the output V11d corresponding to V11 in FIG. 3 and V1 in FIG. 4, and QP2-QN2 defining the output V12d corresponding to V12 in FIG. 3 and V2 in FIG. 4. In FIG. 3, the outputs (V11d and V12d) of the phase shifter 140 are supplied to switch 32 which then couples the outputs to mixers 16 and 18. Extra phase shifts introduced by the differential amplifiers in the 1.4-GHz phase shifter have no effects on the phase tracking between two phase shifters since equal phase shift is contributed from each amplifier (limited by device matching).

Figure 6:
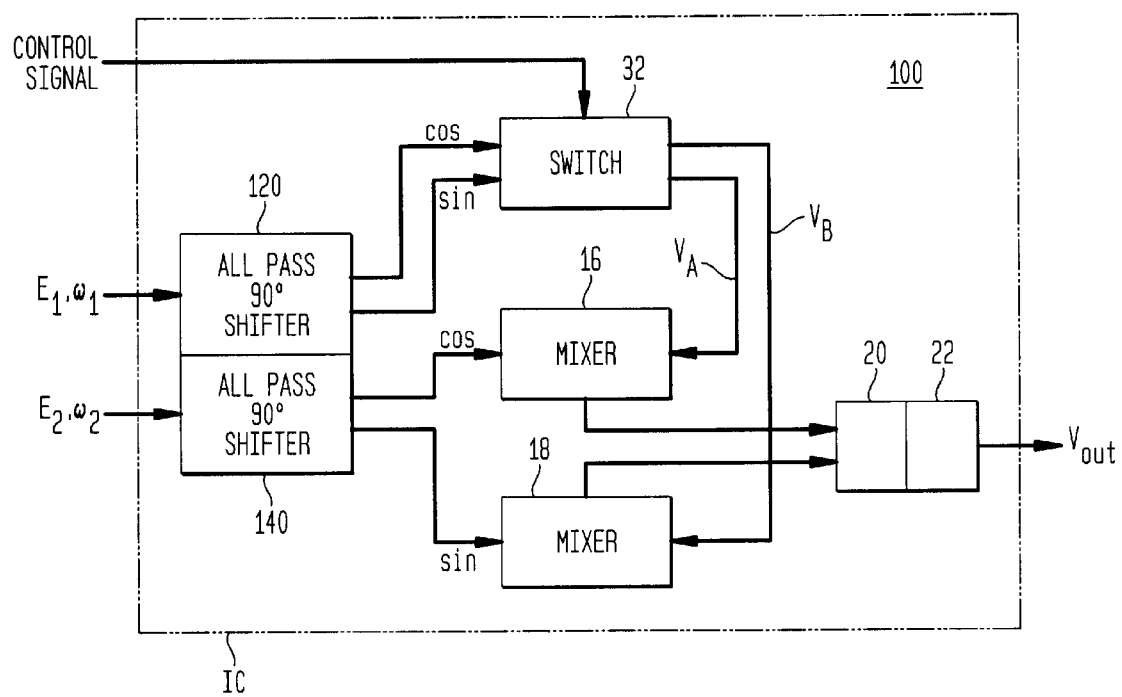
FIG. 6 is a simplified plan view of an integrated circuit in which the phase shift circuits are formed.

It should be appreciated that all-pass phase shifters 120 and 140 may be formed on the same IC as shown in FIG. 6.

By forming the two circuits in close proximity and on the same IC, the components are subject to the same processing steps and will have similar characteristics. Any tolerance errors in one phase shifter will likewise occur in the other phase shifter. Also, any changes in one phase shifter will be tracked in the other phase shifter.

It is important to note that given the frequency (e.g., $\omega$) at which each phase shifter is to operate and knowing the capacitance of the phase shifter, the resistance R of the phase shifting network may be determined by setting $\omega RC=1$. In order for θ1 of the first phase shifter operating at $\omega$1 to be equal to θ2 of the second phase shifter operating at $\omega$2, it is necessary that the product of R1, C1, and $\omega_1$ of the first phase shifter be made equal to the product of R2, C2, and $\omega_2$ of the second phase shifter. Using IC technology to from the phase shifters does not guaranty that the values of θ1 and/or θ2 will be zero. In fact, they may not generally be equal to zero. However, the ratio of the components causing the existence of non-zero θ1 and θ2 ensures that the relationship of θ1=θ2, once established, will remain relatively constant where the phase shifters and their networks are formed on the same IC by the same process and are subjected to the same environmental and voltage/current conditions. Maintaining the ratio of the phase shifting networks constant (e.g., $R1/R2 = \omega_2 C2/\omega_1 C1$) ensures that θ1=θ2 over the range of operation. As noted and demonstrated above, maintaining θ1=θ2 results in high sideband rejection when the outputs of the mixers are combined (e.g., the output of one mixer is subtracted from the output of the other). Note that virtually the entire mixer system 100 may be formed on the same IC; that is, the cross switch 32, the mixers 16 and 18, combiner 20 and buffer circuits 22 may be formed on the same IC.

Figure 3A:
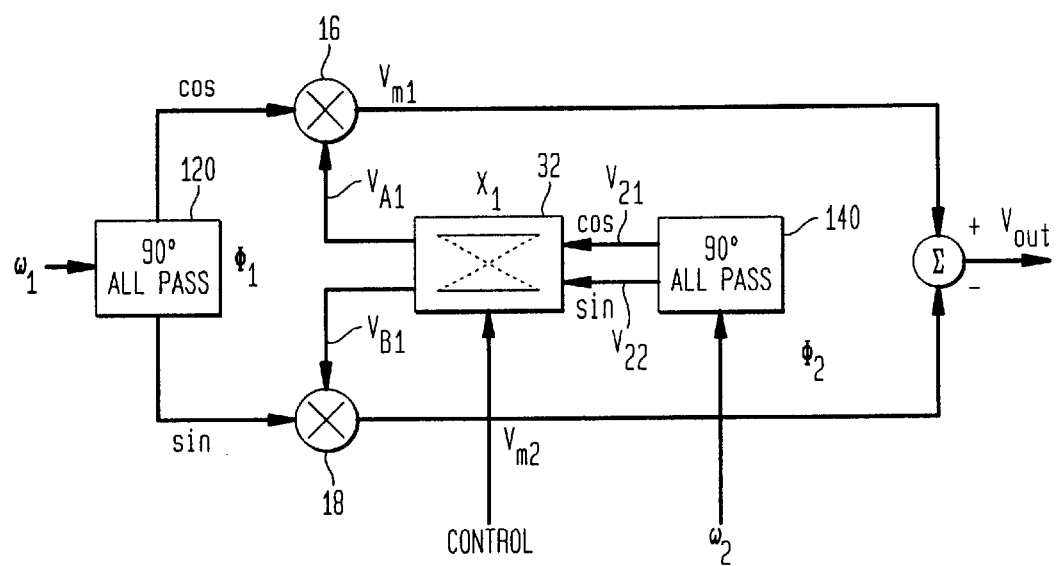
FIG. 3A is another block diagram of a dual frequency single sideband mixer system.

Reference is now made to FIG. 3A to illustrate that, alternatively to the showing of FIG. 3, the outputs of phase shifter 120.may be fixedly connected to mixers 16 and 18 while the outputs of phase shifter 140 may be applied to switch 32, with switch 32 being controlled by a control signal to determine which output of phase shifter 140 is applied to mixer 16 and which is applied to mixer 18. That is, for one condition of the switch 32, the outputs V21 and V22 of phase shifter 140 are applied to VA1 and VB1 and for the other condition of switch 32, V21 is applied to VB1 And V22 is applied to VA1. Note that the IC of FIG. 6 would have to be appropriately modified to complement the mixer system of FIG. 3A.

Figure 7:
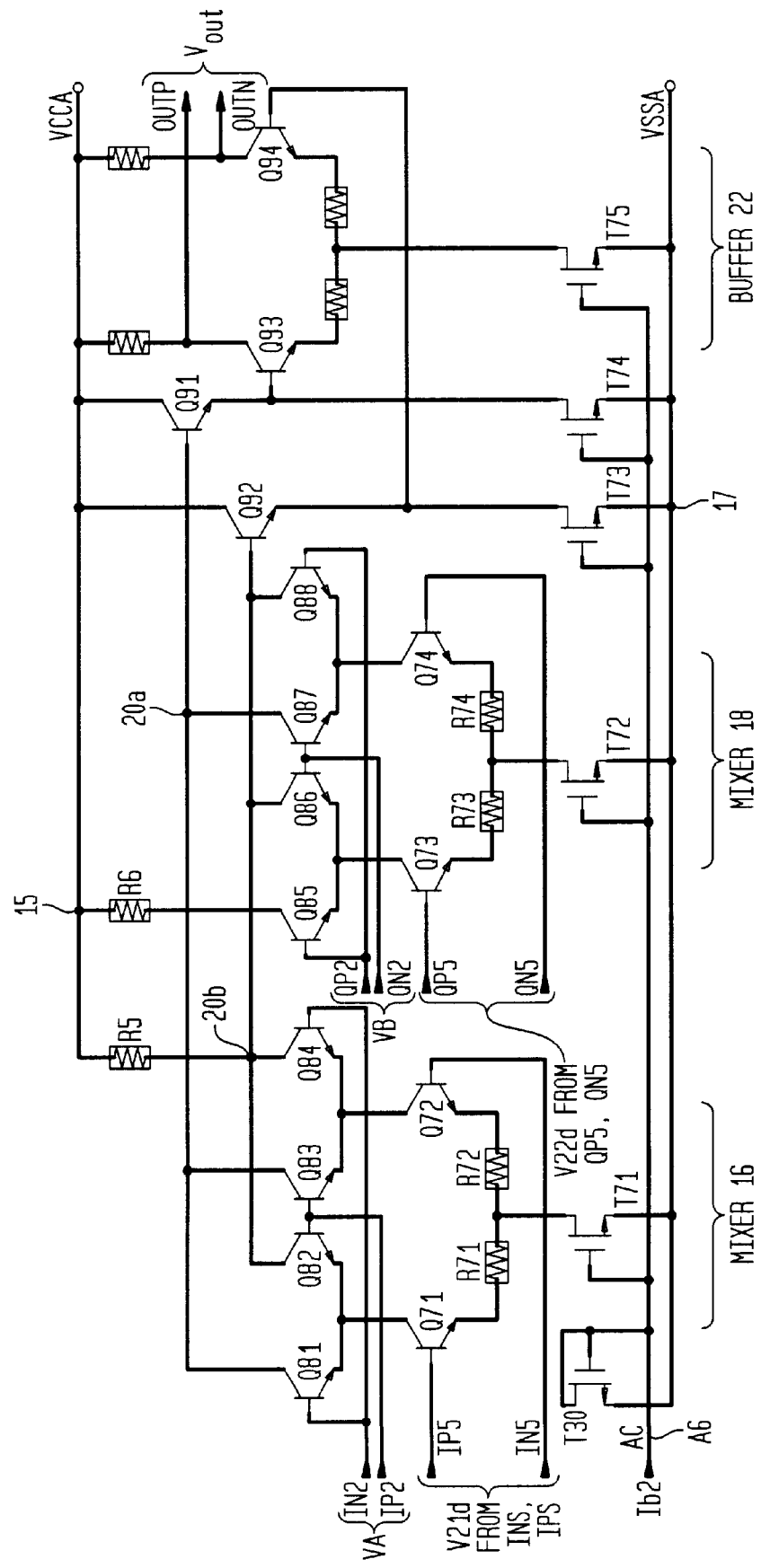
FIG. 7 is a schematic diagram of a mixer circuit for use in circuits embodying the invention.

The mixer circuits 16 and 18 of FIG. 3 may be implemented by mixer circuits identified as 16 and 18, as shown in FIG. 7, or by any other suitable mixer circuit. FIG. 7 is a schematic diagram of mixer circuits 16 and 18 suitable for practicing the invention, and of difference combining circuitry 20a, 20b and output buffer circuitry 22, shown in FIGS. 3 and 6. Each one of the mixer circuits 16 and 18 comprises a "Gilbert" double-balanced (or tree-like) switching mixer to implement a fully differential design. The structure and function of these mixer circuits is known and need not be greatly detailed. The lower input stage of mixer 16 includes differentially connected transistors Q71, Q72. The upper stage of mixer 16 includes differentially connected transistors Q81, Q82 and differentially connected transistors Q83, Q84. The lower input stage of mixer 18 includes differentially connected transistors Q73, Q74. The upper stage of mixer 18 includes differentially connected transistors Q85, Q86 and differentially connected transistors Q87, Q88. The collectors of transistors Q81, Q83, Q85, and Q87 are connected in common to node 20a. The collectors of transistors Q82, Q84, Q86, and Q88 are connected in common to node 20b. Nodes 20a and 20b function to provide the combining (summing or differencing) of the input frequency signals supplied to phase shifters 120 and 140. Difference combining is readily accomplished in the current domain at the collectors of Q81, Q83, Q85, and Q87 and Q82, Q84, Q86, and Q88. Thus, in FIG. 7 the combined output is produced by hard wiring the outputs of the mixer circuits. The outputs at nodes 20a and 20b are applied to the bases of emitter follower transistors Q91, Q92 whose outputs drive a differential output stage comprising transistors Q93, Q94. The differential SSB mixer outputs, $V_{OUT}$, (OUTP and OUTN) are taken from the collectors of Q93 and Q94. It is these outputs which define the output $V_{OUT}$, also shown in FIGS. 3, 3A and 6.

To minimize the occurrence of spurs, 0.6-GHz signals are used to drive the bases of the "lower" input stages Q71, Q72, Q73, Q74 of the mixers; while 1.4-GHz signals are used to drive the bases of the "upper" input stages Q81-Q88. Emitter degeneration resistors R71, R72, R73 and R74 in the lower input stages are used to suppress spurs resulting from non linearities in the input transconductance stages Q71, Q72 and Q73, Q74.

Thus, in FIG. 7, the 0.6-GHz signals are applied to the "lower" level of the mixer stages and the 1.4-GHz signals are applied to the "upper" level of the mixer stages. However, it should be appreciated that the converse connections could be made.

Also, FIG. 7 shows the mixer connection for the system of FIG. 3. For the system of FIG. 3A, the output of phase shifter 120 would be fixedly connected to preselected mixer inputs while the outputs of phase shifter 140 would be coupled to outputs VA1 and VA2 which would then be applied to appropriate mixer inputs.

In FIG. 7 transistors T71–T75 are current source transistors which mirror the current through a diode connected transistor T30 supplied by a current source Ib2.

Figure 8:
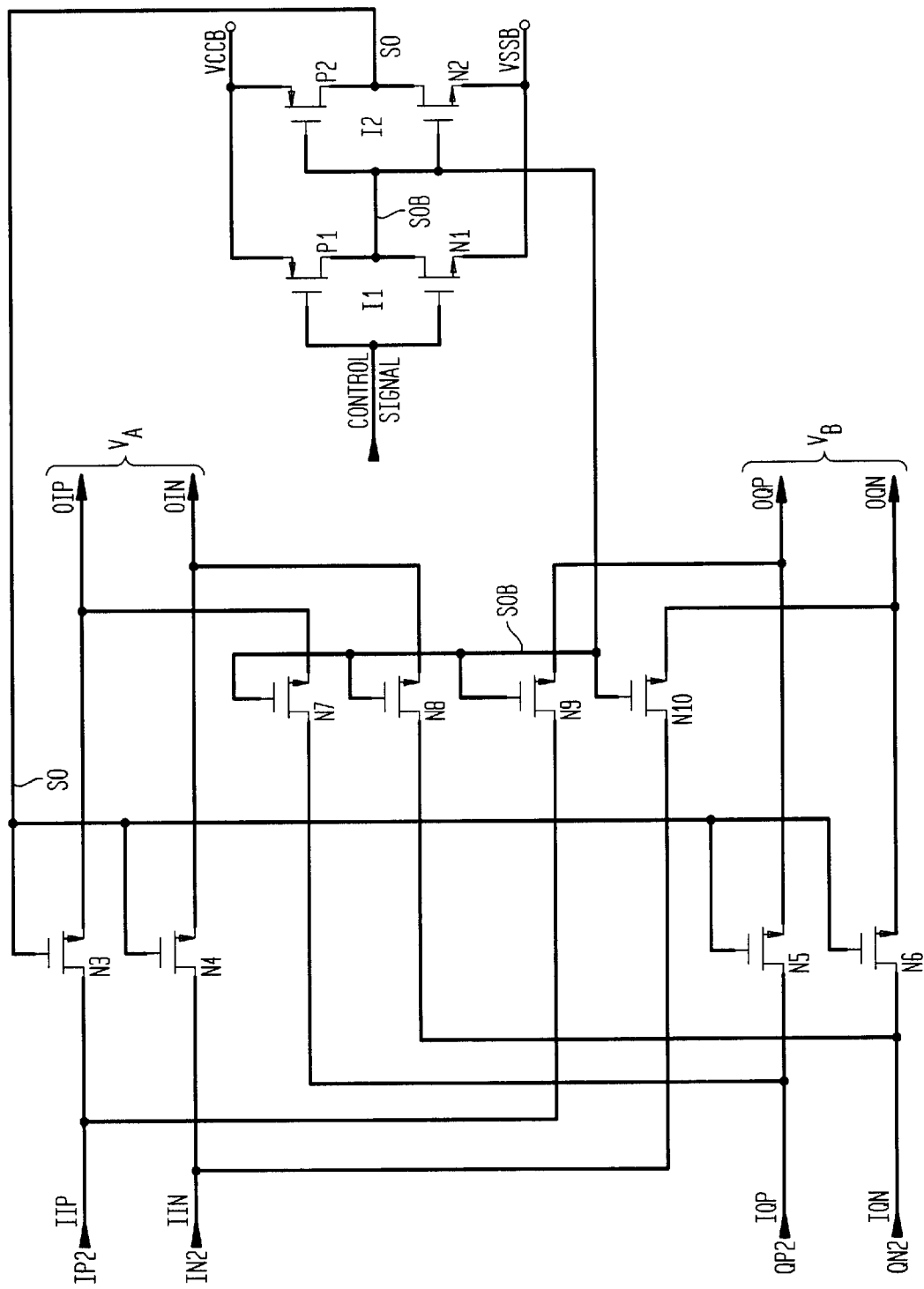
FIG. 8 is a schematic diagram of a cross switch suitable for use in circuits embodying the invention.

The cross switch 32 may be implemented with eight CMOS transmission gates (N3–N10) as shown in FIG. 8 and two complementary inverters ($I_1$, $I_2$). Four transmission gates are used for routing IP5, IN5, QP5, and QN5 in the "through" connection state while the other four transmission gates provide conduction paths in the "reverse" connection. The cross switch 32 includes a first complementary MOS (CMOS) inverter, $I_1$, comprised of MOS transistors P1 and N1 and a second MOS inverter, $I_2$, comprised of MOS transistors P2 and N2. When the control signal is "high", the output SOB (SO "bar") of inverter $I_1$ is "low and the output SO of inverter $I_2$ is "high". When SO is high and SOB is low, transistors N3, N4, N5 and N6 are turned on and transistors N7, N8, N9 and N10 are turned off. When SO is high, the signals IP2, IN2 from phase shifter 120 are coupled to node VA and the signals QP2, QN2 from the phase shifter 120 are coupled to node VB. When the control signal is low, SOB is high and SO is low. For this condition, transistors N3, N4, N5 and N6 are turned off and transistors N7, N8, N9 and N10 are turned on. When SOB is high, the signals QP2, QN2 from phase shifters (120 or 140) are coupled to VA and the signals IP2, IN2 from phase shifters (120 or 140) are coupled to VB. It should be appreciated that cross switch 32 may be implemented using any known circuit arrangement providing the function described above.

A dual-frequency SSB mixer embodying the invention was fabricated in a 0.5 micrometer, 18 GHz $f_T$ BiCMOS process. Under test, the outputs exhibited a sideband rejection in excess of 30dB, which is indeed a high degree of sideband rejection.

What is claimed is:

1. A single sideband mixer system comprising:

first and second 90 degree phase shifters, each one of said phase shifters being of an all-pass type and each one having an input port and an output port;

input circuitry for applying a first input frequency ($\omega 1$) to the input port of the first phase shifter for producing at its output port a first frequency signal equal to $A_1 \cos \omega_1 t$ and a second frequency signal equal to $B_1 \sin(\omega_1 t + \theta_1)$; wherein the first phase shifter is of the type which causes A1 to be substantially equal to B1;

input circuitry for applying a second input frequency ($\omega 2$) to the input port of the second phase shifter for producing at its output port a third frequency signal equal to $A_2 \cos \omega_2 t$ and a fourth frequency signal equal to $B_2 \sin(\omega_2 t + \theta_2)$; wherein the second phase shifter is of the type which causes A2 to be substantially equal to B2;

wherein $\theta 1$ defines the angle by which the first and second frequency signals deviate from being orthogonal to each other;

wherein $\theta 2$ defines the angle by which the third and fourth frequency signals deviate from being orthogonal to each other;

first and second mixer circuits, each mixer circuit having two inputs and an output at which is produced a signal which is a function of the product of its two inputs;

coupling circuitry for applying one frequency signal from each of said first and second phase shifters to the inputs of the first mixer circuit and for applying the other frequency signal from each one of said first and second phase shifters to the inputs of the second mixer circuit;

combining circuitry for combining the outputs of the two mixers to produce an output signal which is a function of either the sum or the difference of the first and second input frequencies; and wherein said first and second phase shifters are formed on and within the same integrated circuit;

wherein each one of said first and second phase shifters includes resistive-capacitance (RC) networks for generating the first and second frequency signals so they are generally orthogonal to each other at the operating frequency of the first phase shifter and the third and fourth frequency signals so they are generally orthogonal to each other at the operating frequency of the second phase shifter; and wherein the first and second phase shifters are formed in close proximity to each other on said IC to ensure that any variation in the components of the first and second phase shifters track each other.

2. A single sideband mixer as claimed in claim 1 wherein $\theta 1$ is designed to be substantially equal to $\theta 2$.

3. A single sideband mixer as claimed in claim 2 wherein $\theta 1$ and $\theta 2$ are substantially equal to each other and are non-zero.

4. A single sideband mixer system comprising:

first and second 90 degree phase shifters, each one of said phase shifters being of an all-pass type and each one having an input port and an output port;

input circuitry for applying a first input frequency ($\omega 1$) to the input port of the first phase shifter for producing at its output port a first frequency signal which is a function of the cosine of the first input frequency and a second frequency signal which is a function of the sine of the first input frequency signal;

input circuitry for applying a second input frequency ($\omega 2$) to the input port of the second phase shifter for producing at its output port a third frequency signal which is a function of the cosine of the second input frequency and a fourth frequency signal which is a function of the sine of the second input frequency signal;

first and second mixer circuits, each mixer circuit having two inputs and an output at which is produced a signal which is a function of the product of its two inputs;

coupling circuitry for applying one frequency signal from each of said first and second phase shifters to the inputs of the first mixer circuit and for applying the other frequency signal from each one of said first and second phase shifters to the inputs of the second mixer circuit;

wherein said coupling circuitry for applying the frequency signals from the phase shifters to the inputs of the first and second mixer circuits includes a selectively enabled switching circuit coupled between the output port of the first phase shifter and the inputs of the first and second mixer circuits for, in one state, applying the first frequency signal to an input of the first mixer circuit and the second frequency signal to an input of the second mixer circuit and for, in the other state, applying the first frequency signal to the input of the second mixer circuit and the second frequency signal to the input of the first mixer circuit; and combining circuitry for combining the outputs of the two mixers to produce an output signal which is a function of either the sum or the difference of the first and second input frequencies.

5. A single sideband mixer system comprising:

first and second 90 degree phase shifters, each one of said phase shifters being of the all-pass type and each one having an input port and an output port;

input circuitry for applying a first input frequency ($\omega 1$) to the input port of the first phase shifter for producing at its output port a first frequency signal which is a function of the cosine of the first input frequency and a second frequency signal which is a function of the sine of the first input frequency signal;

input circuitry for applying a second input frequency ($\omega 2$) to the input port of the second phase shifter for producing at its output port a third frequency signal which is a function of the cosine of the second input frequency and a fourth frequency signal which is a function of the sine of the second input frequency signal;

first and second mixer circuits, each mixer circuit having two inputs and an output at which is produced a signal which is a function of the product of its two inputs;

coupling circuitry for applying one frequency signal from each of said first and second phase shifters to the inputs of the first mixer circuit and for applying the other frequency signal from each one of said first and second phase shifters to the inputs of the second mixer circuit;

wherein said coupling circuitry for applying the frequency signals from the phase shifters to the inputs of the first and second mixer circuits includes a selectively enabled switching circuit coupled between the output port of the second phase shifter and the inputs of the first and second mixer circuits for, in one state, applying the third frequency signal to an input of the first mixer circuit and the fourth frequency signal to an input of the second mixer circuit and for, in the other state, applying the third frequency signal to the input of the second mixer circuit and the fourth frequency signal to the input of the first mixer circuit; and combining circuitry for combining the outputs of the two mixers to produce an output signal which is a function of either the sum or the difference of the first and second input frequencies.

6. A single sideband mixer system as claimed in claim 4 a wherein the outputs of the first and second mixer circuits are fixedly connected to each other to produce a combined output.

7. A single sideband mixer system as claimed in claim 6 wherein the combination of the mixer outputs functions to subtract the output of one mixer from the output of the other mixer.

8. A single sideband mixer system as claimed in claim 4 wherein said first and second phase shifters are formed within the same integrated circuit.

9. A single sideband mixer system as claimed in claim 8 wherein the first and second phase shifters are formed in the integrated circuit such that the amplitude of the first and second frequency signals are designed to be substantially equal to each other and the amplitude of the third and fourth frequency signals are designed to be substantially equal to each other; and wherein the phasal relationship ($\theta 1$) of the first frequency signal to the second frequency signal and the phasal relationship ($\theta 2$) of the third frequency signal to the fourth frequency signal are designed to be approximately equal.

10. A single sideband mixer system comprising:

first and second phase shifters; each phase shifter having an input port and an output port;

input circuitry for applying a first input frequency ($\omega_1$) to the input port of the first phase shifter for producing at its output a first frequency signal which is equal to $A_1 \cos \omega_1 t$ and a second frequency signal which is equal to $B_1 \sin(\omega_1 + \theta_1)$, said first phase shifter being of the type which causes the amplitude $A_1$ and $B_1$ to be substantially equal over a full range of operating frequencies and where el is equal to the phase angle error defining the deviation from quadrature of the first and second frequency signals;

input circuitry for applying a second input frequency ($\omega_2$) to the input port of the second phase shifter for producing a third frequency signal which is equal to $A_2 \cos \omega_2 t$ and a fourth frequency signal which is equal to $B_2 \sin(\omega_2 t + \theta_2)$, said second phase shifter being of the type which causes the amplitude $A_2$ and $B_2$ to be substantially equal over a full range of operating frequencies and where $\theta 2$ is equal to the phase angle error defining the deviation from quadrature of the third and fourth frequency signals;

first and second mixer circuits, each mixer circuit having two inputs and an output at which is produced a signal which is equal to the product of its two inputs;

means for applying one frequency signal from each one of said first and second phase shifters to the inputs of the first mixer circuit and means for applying the other frequency signal from each one of said first and second phase shifters to the inputs of the second mixer circuit;

combining circuitry for combining the outputs of the two mixers to produce an output signal which is a function of either the sum or the difference of the two input frequencies; wherein $\theta_1$ is equal to $\theta_2$, and wherein the means for applying the frequency signals to the mixers includes a switching circuit, and wherein the two outputs of one of the first and second phase shifters are applied to the switching circuit which, in response to one value of a control signal couples one of the phase shifter outputs to an input of the first mixer circuit and the other one of the phase shifter outputs to an input of the second mixer circuit, and which, in response to another value of the control signal couples said one of the phase shifter outputs to an input of the second mixer circuit and said other one of the phase shifter outputs to an input of the first mixer circuit.

11. A single sideband mixer system as claimed in claim 10 wherein said first and second phase shifters are formed on the same integrated circuit, in close proximity to each other and by the same processes to ensure that their components vary in a similar manner as a function of time and operating condition.

12. A single sideband mixer system as claimed in claim 10 wherein for one value of the control signal the output signal has a frequency which is a function of the sum of the first and second input frequencies and wherein for another value of the control signal the output signal is a function of the difference between the first and second input frequencies.

13. A single sideband mixer system comprising:

an integrated circuit (IC) including first and second phase shifters formed therein;

each one of said first and second phase shifters for producing at its output first and second signals of substantially equal amplitude with a phase angle between the first and second signals designed to be equal to 90 degrees but subject to a phase angle error; the phase angle error of the first phase shifter being denoted as θ1 and the phase angle error of the second phase shifter being denoted as θ2;

said first and second phase shifters being formed within the IC by the same process and in the same manner and in close proximity to each other, whereby θ1 is substantially equal to θ2, and θ1 remains substantially equal to θ2 for all operating conditions of the mixer system;

first and second mixer circuits; each one of said first and second mixer circuits having first and second inputs and an output;

switching circuitry for connecting the first and second outputs of the first phase shifter to inputs of the first and second mixer circuits;

means fixedly connecting the first output of the second phase shifter to the other input of the first mixer circuit and the second output of the second phase shifter to the other input of the second mixer circuit; and combining circuitry for combining the outputs of the first and second mixer circuits.

14. A single sideband mixer system as claimed in claim 13, wherein said switching circuitry is responsive to a binary valued control signal for, in response to one value of the control signal, coupling the first signal of the first phase shifter to an input of the first mixer circuit and the second signal of the first phase shifter to an input of the second mixer circuit, and for, in response to another value of the control signal, coupling the first signal of the first phase shifter to an input of the second mixer circuit and the second signal of the first phase shifter to an input of the first mixer circuit.

15. A single sideband mixer system as claimed in claim 14, wherein:

a first input frequency signal ($\omega_1$) is applied to the first phase shifter for causing its first signal to be a function of the cosine of the first input frequency signal and its second signal to be a function of the sine of the first input frequency signal; and a second input frequency signal ($\omega_2$) is applied to the second phase shifter for causing its first signal to be a function of the cosine of the second input frequency signal and its second signal to be a function of the sine of the second input frequency signal.

16. A single sideband mixer system as claimed in claim 15 wherein $\omega_1$ is greater than $\omega_2$.

17. A single sideband mixer system as claimed in claim 15 wherein $\omega_2$ is greater than $\omega_1$.

18. A single sideband mixer system as claimed in claim 14 wherein the outputs of the mixer circuits are hard wired to produce an output which is a function of the current output of one mixer circuit subtracted from the current output of the other mixer circuit.

* * * * *